United States Patent
Spivey et al.

(10) Patent No.: US 7,372,705 B1
(45) Date of Patent: May 13, 2008

(54) PORTABLE DATA ROUTING DEVICE AND METHOD OF USE

(75) Inventors: Thomas Spivey, Pleasanton, CA (US); Tracy Winn, Mountain View, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/344,994

(22) Filed: Feb. 1, 2006

(51) Int. Cl.
*H05K 7/20* (2006.01)
*H05K 7/14* (2006.01)

(52) U.S. Cl. .................. 361/796; 361/752; 361/720; 361/688; 361/704; 361/707; 174/520

(58) Field of Classification Search ............. 361/711, 361/709, 710, 707, 704, 688, 719, 721, 687, 361/720, 730, 752, 796, 797, 788; 174/16.1, 174/16.3, 50, 520; 165/80.3, 104.33
See application file for complete search history.

(56) References Cited

U.S. PATENT DOCUMENTS

| | | | | |
|---|---|---|---|---|
| 4,656,559 A | * | 4/1987 | Fathi | 361/721 |
| 5,276,584 A | * | 1/1994 | Collins et al. | 361/718 |
| 5,309,315 A | * | 5/1994 | Naedel et al. | 361/704 |
| 5,343,361 A | * | 8/1994 | Rudy et al. | 361/710 |
| 5,812,374 A | * | 9/1998 | Shuff | 361/704 |
| 5,844,777 A | * | 12/1998 | Gates | 361/700 |
| 5,946,193 A | * | 8/1999 | Hendrix et al. | 361/704 |
| 6,728,104 B1 | | 4/2004 | Ahmad et al. | 361/704 |
| 6,862,180 B2 | * | 3/2005 | Sawyer et al. | 361/690 |
| 6,914,780 B1 | | 7/2005 | Shanker et al. | 361/687 |
| 6,957,047 B1 | | 10/2005 | Young et al. | 455/83 |
| 7,019,976 B1 | | 3/2006 | Ahmad et al. | 361/704 |
| 7,078,619 B2 | * | 7/2006 | Chamberlain | 174/50 |
| 2002/0035416 A1 | * | 3/2002 | De Leon | 701/14 |
| 2002/0070043 A1 | * | 6/2002 | Kitajima | 174/50 |
| 2003/0000721 A1 | * | 1/2003 | Garner | 174/50 |
| 2003/0015334 A1 | * | 1/2003 | Clement et al. | 174/50 |

OTHER PUBLICATIONS

"T-flex™ 600 Series", Thermagon, Inc. A Division of Laird Technologies.

* cited by examiner

*Primary Examiner*—Diego Gutierrez
*Assistant Examiner*—Dameon E Levi
(74) *Attorney, Agent, or Firm*—BainwoodHuang

(57) ABSTRACT

A data communications device, such as a router, is configured for use in an outdoor environment. The router includes wireless communications circuit boards mounted within an environmentally sealed housing. The housing protects the circuit boards from exposure to extreme environmental conditions such as relatively high temperatures, rain, or snow to maintain the operability of the router. The router also includes a thermal transfer assembly disposed within the sealed housing that conducts heat away from the router's circuit board components. Because the thermal transfer assembly operates using conduction rather than convection, the data communications device does not require the use of a fan assembly to remove heat from the circuit board components. This minimizes the overall size and weight of the data communications device, allowing the device to be deployed in a variety of outdoor locations, such as traffic signal poles, curb side cabinets, or vehicles.

21 Claims, 15 Drawing Sheets

PORTABLE DATA ROUTING DEVICE AND METHOD OF USE

BACKGROUND

Conventional networks typically include data communications devices that transmit data packets from one or more sources to one or more destinations. Certain data communications devices, such as routers, receive packets containing data and control information at input ports, and, based on destination or other information included in the packets, route the packets to appropriate output ports that lead to either another router or to the packet's final destination.

Conventional routers are designed for use within environmentally controlled locations. For example, low capacity routers are typically used in home networks to route data among personal computers. High-performance routers, commonly used within enterprises such as telecommunication companies and Internet service providers, provide relatively high bandwidth packet routing and can process packets for many thousands of different end users. In either case, the routers operate indoors under conditions of substantially controlled temperature and controlled humidity which helps to maintain the operability of the devices.

Additionally, conventional routers typically include certain cooling mechanisms, such as fan assemblies, that remove heat from the router's circuit boards and circuit board components via convection. The fan assemblies help to maintain the temperature of the router's components below a particular threshold to maintain the router's operability during use.

SUMMARY

The use of certain data communications devices, such as routers, in particular scenarios suffers from a variety of deficiencies. For example, conventional router devices can provide substantially reliable packet routing when used within the confines of a controlled (e.g., indoor) environment, such as within a home or enterprise. These same routers, however, are prone to failure when used outside of the controlled environment. For example, when used in an outdoor environment, conventional routers can be exposed to relatively extreme weather conditions such as rain, snow, or relatively high temperatures. As a result of such exposure, the electronic components forming the conventional routers can become inoperable or malfunction over time.

Certain data communications devices, such as wireless access points and certain types of routers, are designed for outdoor use and can operate within relatively extreme weather conditions. However, such data communications devices typically utilize a fan assembly to provide convective cooling to the circuit board components associated with the devices. The fan assemblies increase the overall size and weight of the data communications devices and, as such, limit the mobility of the devices. Additionally, because the fan assemblies include moving parts, the operability of the fan assemblies must be monitored and replaced over time. For data communications devices mounted in remote locations, such as at the top of a telephone pole or traffic signal, such monitoring and replacement can be time consuming and costly.

By contrast to conventional data communications devices, embodiments of the invention are directed to data communications devices, such as routers, configured for use in an outdoor environment. The router includes wireless communications circuit boards (router cards, Ethernet cards, etc.) mounted within an environmentally sealed housing. The housing protects the circuit boards from exposure to extreme environmental conditions, such as relatively high temperatures, rain, or snow, to maintain the router's operability. The router also includes a thermal transfer assembly disposed within the sealed housing that conducts heat away from the router's circuit board components. Because the thermal transfer assembly operates using conduction rather than convection, the data communications device does not require the use of moving components, such as a fan assembly, to remove heat from the circuit board components. This minimizes the overall size and weight of the data communications device, allowing the device to be deployed in a variety of outdoor locations, such as traffic signal poles, curb side cabinets, or vehicles.

In one arrangement, a data communications device comprises an environmentally sealed housing having a card chassis and at least one end cap coupled to the card chassis where the housing is configured to provide a barrier between an inner space defined by the housing and an outer space. The data communications device includes a plurality of circuit boards disposed within the inner space of the housing where at least one of the plurality of circuit boards is configured to receive data from a source and direct data to a destination. The data communications device also includes a thermal transfer assembly adapted to thermally couple at least one circuit board component of the plurality of circuit boards to the housing. The thermal transfer assembly includes a plate coupled to the at least one circuit board, a thermal conductor disposed between the plate and the at least one circuit board where the thermal conductor is configured to provide thermal communication between a circuit board component of the at least one circuit board and the plate, and a coupling element operable to thermally couple the plate to the housing. The environmentally sealed housing allows the data communications device to operate in various environmental conditions, such as in cases of relatively high temperatures, rain, or snow in an outdoor environment. Because the thermal transfer assembly operates using conduction rather than convection, the data communications device does not require the use of moving components, such as a fan assembly, to remove heat from the circuit board components, thereby increasing the operation life and reliability of the device.

In one arrangement, a data communications device comprises an environmentally sealed housing having a card chassis and at least one end cap coupled to the card chassis, the housing configured to provide a barrier between an inner space defined by the housing and an outer space. The data communications device also includes a plurality of circuit boards disposed within the housing where at least one of the plurality of circuit boards is configured to receive data from a source and direct data to a destination. The data communications device includes a thermal transfer assembly adapted to thermally couple a circuit board component of at least one circuit board of the plurality of circuit boards to the housing to transfer heat from a circuit board component to the housing via conduction.

One embodiment of the invention relates to a method for assembling a data communications device. The method includes thermally coupling a circuit board to a thermally conductive plate, the thermally conductive plate having a compliant thermally conductive material in thermal communication with the thermally conductive plate and at least one circuit board component of the circuit board. The method also includes inserting the circuit board and thermally conductive plate within a slot of a data communications device housing and expanding a thermal coupling element within the slot to thermally couple the thermally conductive plate to the housing.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to data communications devices, such as routers, configured for use in an outdoor environment. The router includes wireless communications circuit boards (router cards, Ethernet cards, etc.) mounted within an environmentally sealed housing. The housing protects the circuit boards from exposure to extreme environmental conditions such as relatively high temperatures, rain, or snow to maintain the operability of the router. The router also includes a thermal transfer assembly disposed within the sealed housing that conducts heat away from the router's circuit board components. Because the thermal transfer assembly operates under thermal conduction rather than convection, the data communications device does not require the use of a fan assembly to remove heat from the circuit board components. This minimizes the overall size and weight of the data communications device and increases the overall reliability of the device, allowing the device to be deployed in a variety of outdoor locations, such as traffic signal poles, curb side cabinets, or vehicles.

Figure 1:
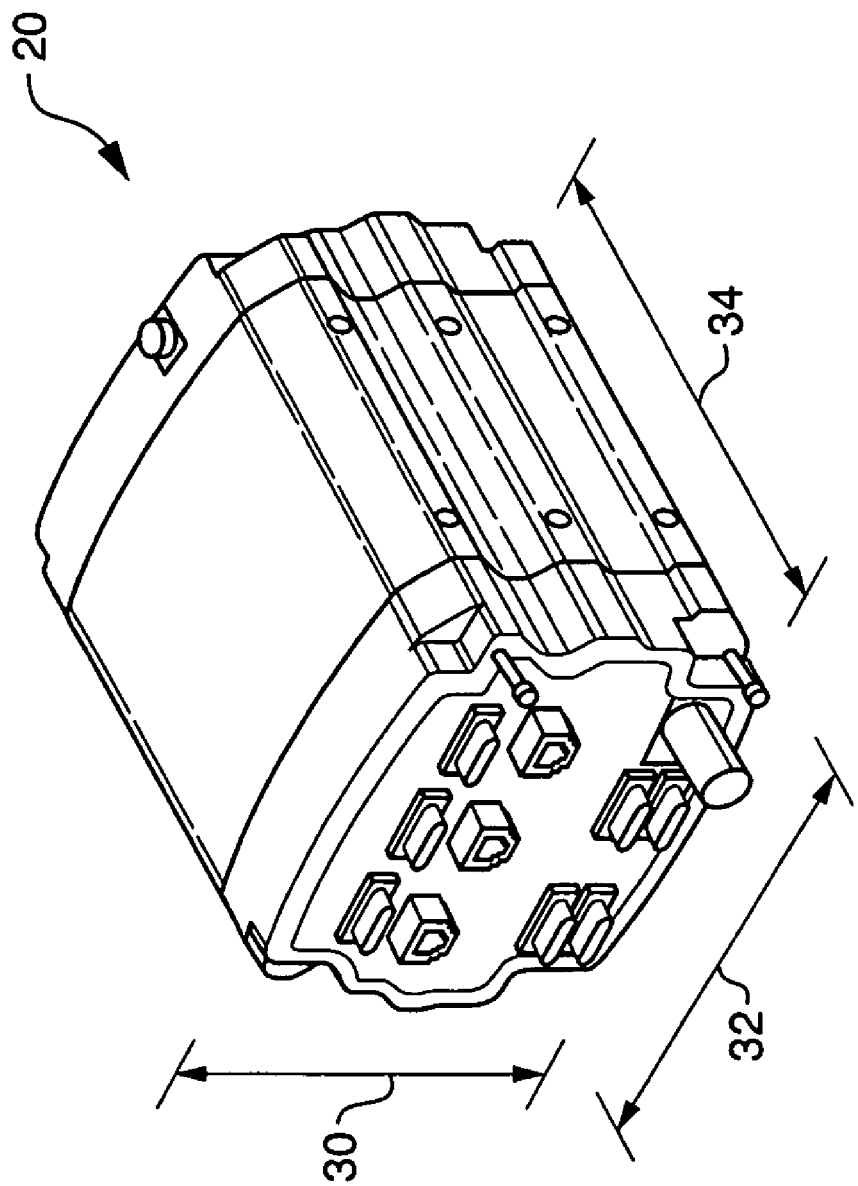
FIG. 1 illustrates an embodiment of a data communications device, according to one embodiment of the invention.

FIG. 1 illustrates a data communications device 20 according to one embodiment of the invention. In one arrangement, the data communications device 20 is a router configured to receive data packets from a source device and, based on destination or other information included in the packets, route the data to an appropriate receiver device. For example, the router is configured to provide layer 3 routing.

Figure 2A:
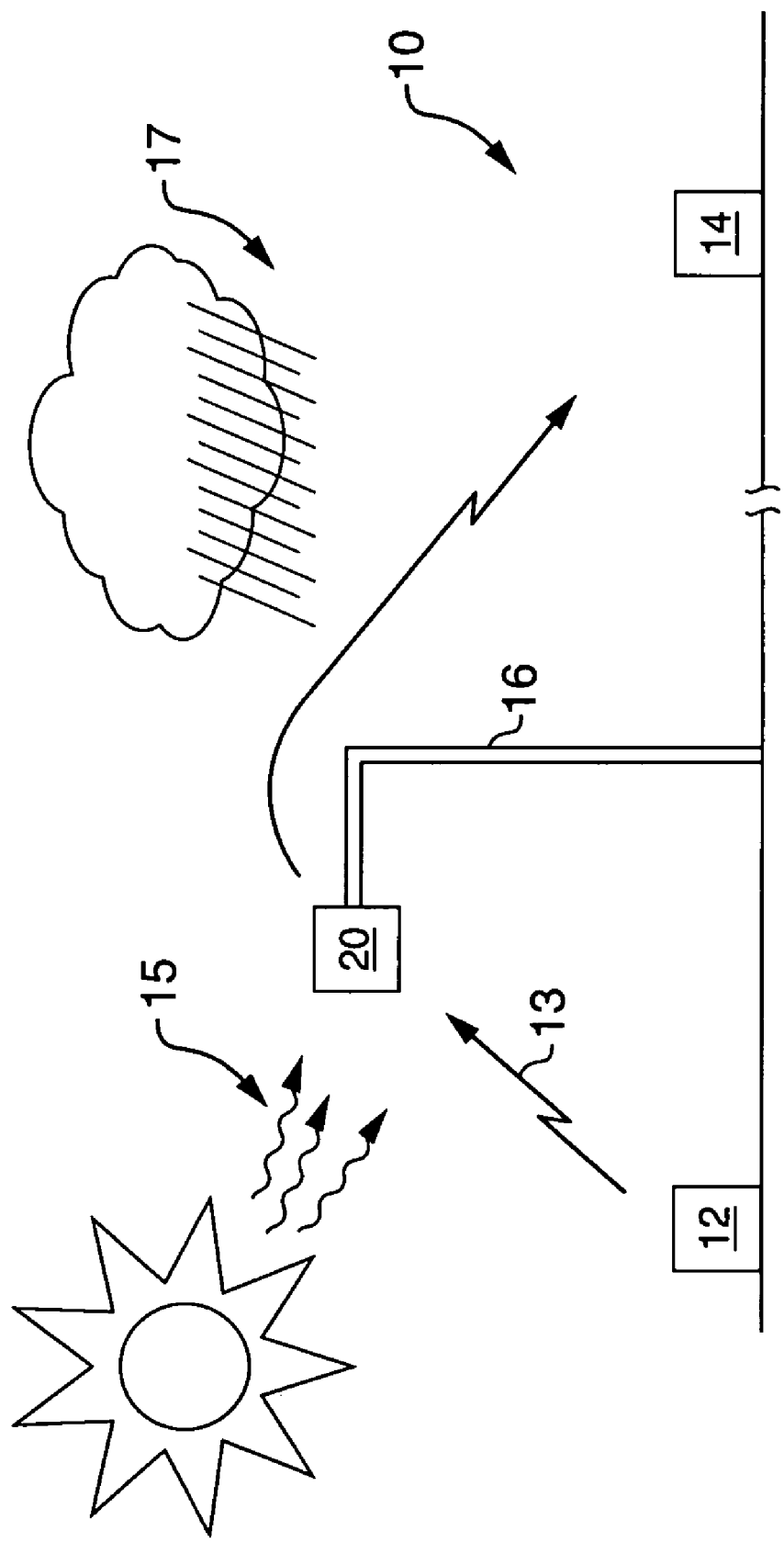
FIG. 2A illustrates a schematic representation of the data communications device of FIG. 1 disposed in a stationary location in an outdoor environment.
Figure 2B:
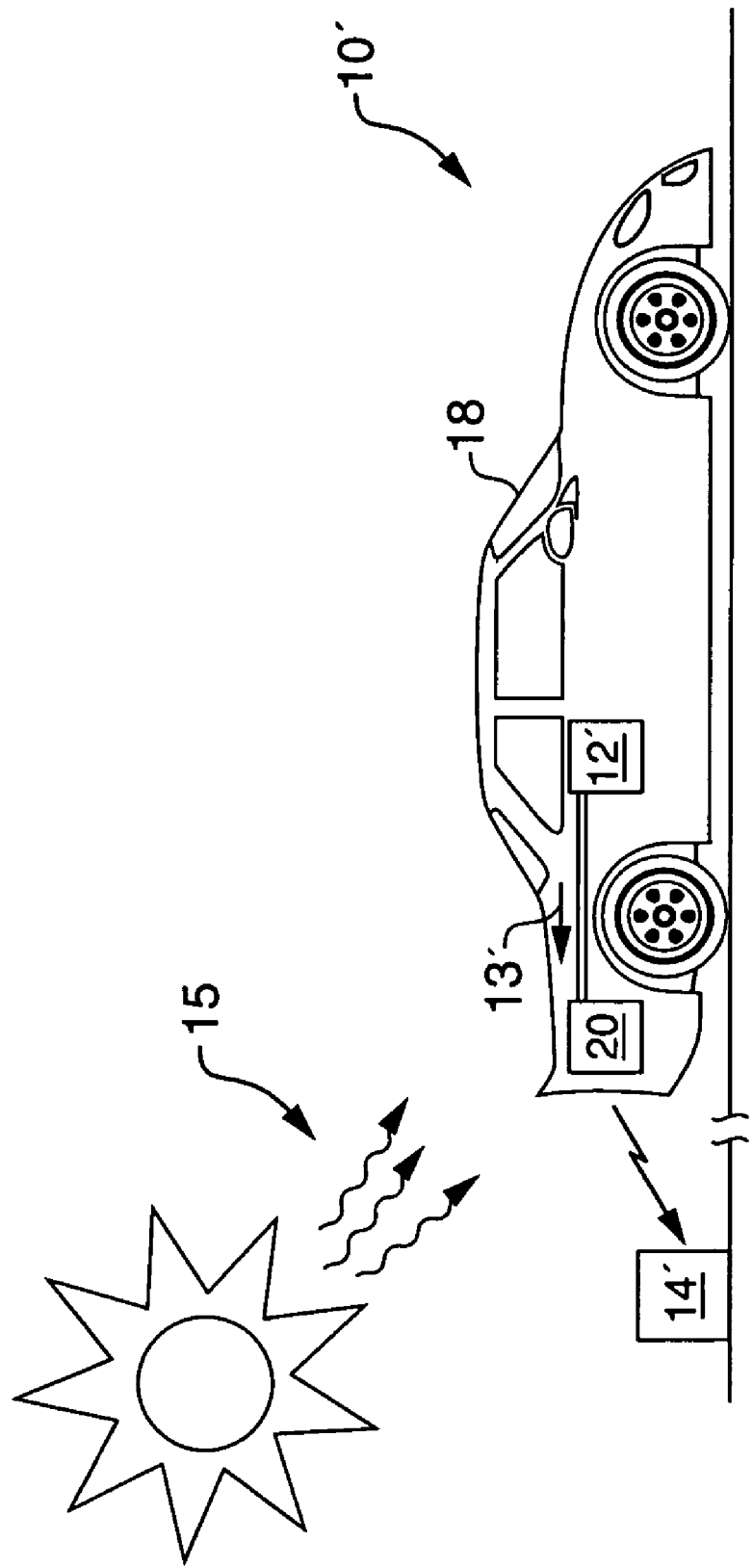
FIG. 2B illustrates a schematic representation of the data communications device of FIG. 1 disposed in a mobile location in an outdoor environment.

As shown in FIGS. 2A and 2B, the data communications device 20, forms part of either a stationary 10 or mobile 10' data communications system. For example, as shown in FIG. 2A, the data communications device 20 is disposed in a stationary location, such as on a traffic signal pole 16. During operation, the device 20 receives wireless communications signals 13 from a transmitter device 12 and routes the signals to a receiver device 14 within the system 10. In another example, as shown in FIG. 2B, the data communications device 20 is disposed in a mobile location, such as in a police patrol car 18, as part of a data communications system 10'. During operation, the data communications device 20 receives a data signal 13', such as video, audio, or text, from a physically coupled device 12' and transmits the signal from the mobile location to a receiver device 14, such as a police station, within the system 10'.

Returning to FIG. 1, the data communications device 20 is configured as an environmentally sealed structure and that provides environmental protection to the electronic components (circuit boards, power supplies, etc.) contained within the device 20. With the data communications device 20 being environmentally sealed, the device 20 limits or prevents ingress of environmental elements, such as air or water, within the data communications device 20 and, as such, is configured to operate in an outdoor environment. For example, as illustrated in FIG. 2A, when the data communications device 20 is mounted in an outdoor location, such as on the traffic signal pole 16, the environmentally sealed data communications device 20 can operate when exposed to relatively severe environmental conditions, such as precipitation 17 (e.g., rain, sleet, or snow) typical in the outdoor location. Also with the device 20 being environmentally sealed, the device 20 can also minimize the transfer of relatively high ambient temperatures to the electronic components contained within the data communications device 20. For example, as illustrated in FIGS. 2A and 2B, the data communications device 20 can be mounted within a location, such as the outdoor location shown in FIG. 2A or the enclosed mobile location shown in FIG. 2B, that experiences a relatively high ambient temperature 15, such as in the range of between about 110° F. and 185° F. With the device 20 being environmentally sealed, the device 20 minimizes the ability for the ambient heat to adversely affect the operation of the electronic components contained within the device 20.

In one arrangement, the data communications device 20 is configured as a relatively compact structure that allows the device 20 to be disposed in the stationary or mobile outdoor environments, such as described above. For example, as shown in FIG. 1, the device 20 has a height 30 between about four inches and six inches, a width 32 between about five inches and seven inches, a length 34 between about seven inches and nine inches, and a weight of approximately 10 pounds. With such dimensions and weight, the data communications device 20 can be mounted to the pole 16 shown in FIG. 2A without requiring the use of specialized "heavy equipment" lifting apparatuses and while minimizing obstruction of any traffic signals disposed on the pole 16. Furthermore, the dimensions and weight of the data communications device 20 also allow the device 20 to be readily transported as part of the mobile vehicle 18 shown in FIG. 2B.

Figure 3:
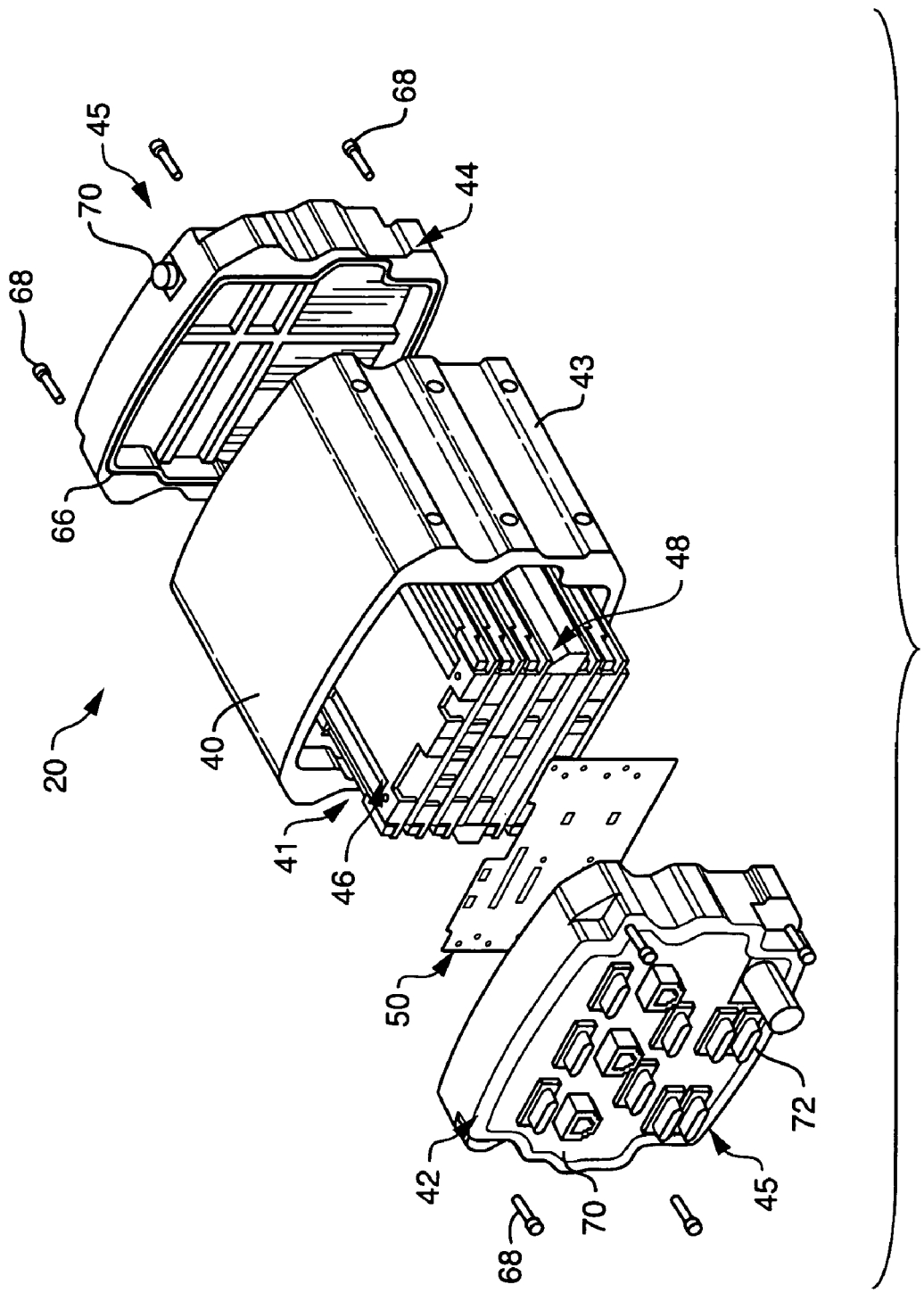
FIG. 3 illustrates an exploded view of the data communications device of FIG. 1, according to one embodiment of the invention.

As indicated above, in one arrangement, the data communications device 20 is configured as a router that receives and transmits data within a data communications system or network and operates in an outdoor environment. While the data communications device 20 can be configured in a variety of ways, FIG. 3 illustrates an example configuration of the data communications device 20. In one arrangement, the data communications device 20 includes a housing 40 having a card chassis 43 and end caps 42, 44, a card stack assembly 41 having one or more circuit boards 46 disposed within the housing 40, and a thermal transfer assembly 48 thermally coupled to the circuit boards 46.

Figure 4:
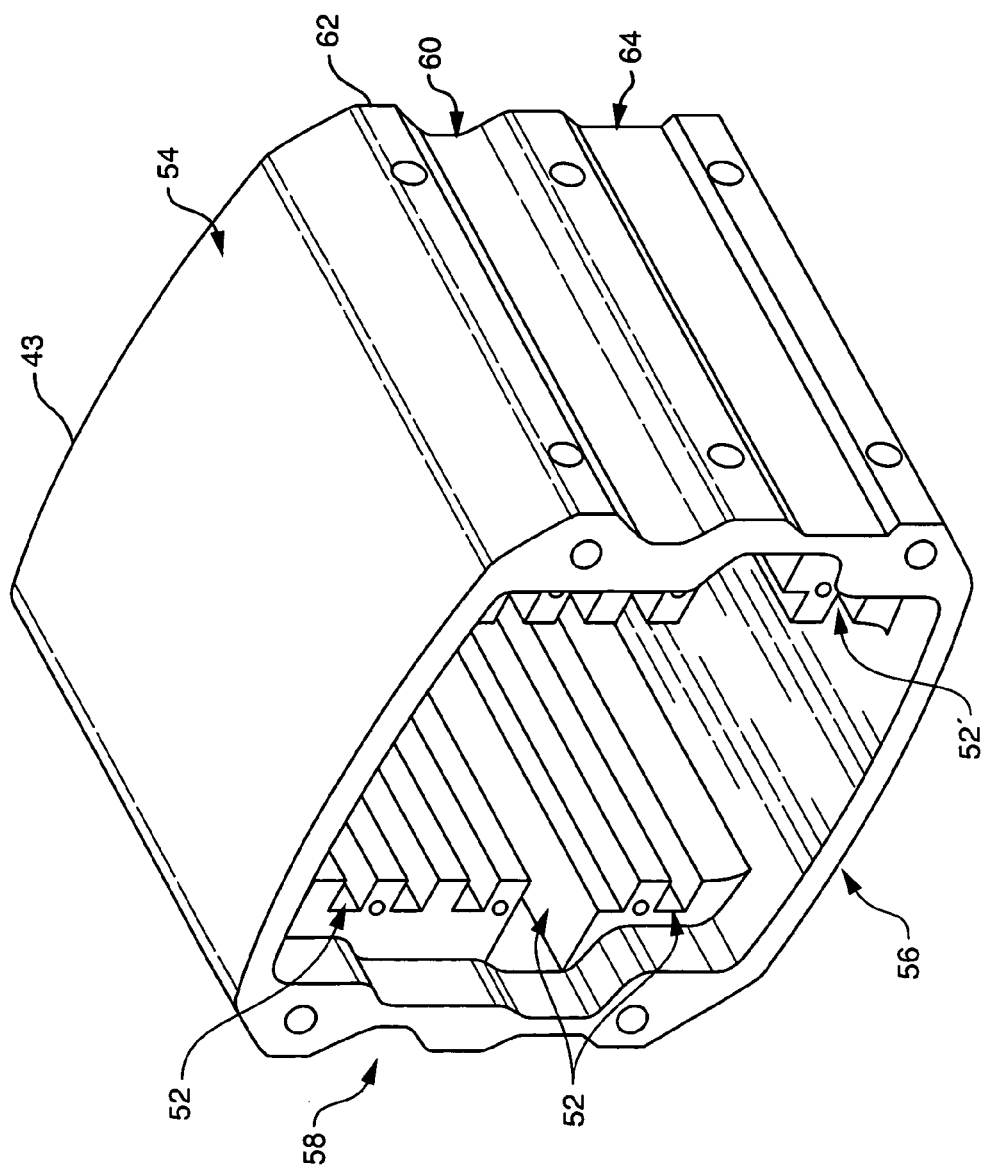
FIG. 4 illustrates a housing of the data communications device of FIG. 1, according to one embodiment of the invention.

The card chassis 43, for example, is formed of an extruded aluminum material which provides a thermal sink for the circuit boards 46, as will be described in detail below. In one arrangement, as shown in FIG. 4, the card chassis 43 includes slots 52 adapted to receive and contain the circuit boards 46. For example, each circuit board 46 includes opposing edges which are adapted to insert within opposing slots 52, 52' formed within the card chassis 43. As the circuit boards 46 are secured within their respective slots 52, the housing 40 provides a degree of structural rigidity to the circuit boards 46. For example, the housing 40 provides a level of shock resistance to the circuit boards 46 when coupled within the slots 52 of the card chassis 43, thereby allowing operation of the data communications device 20 during use in a vibrating or oscillating environment.

As shown in FIG. 4, an outer surface of the housing 40 is configured to provide physical and thermal protection to the circuit boards 46. For example, the card chassis 43 includes an upper surface 54 and a lower surface 56 which each define a substantially curved profile. The curvature of the upper and lower surfaces 54, 56 limits the ability for users to stack multiple data communications devices 20 on top of each other, thereby minimizing the load exerted on the housing 40 and the circuit boards 46 contained therein. Additionally, the curvature of the lower surface 56 helps to minimize a build-up of relatively high-temperature gasses in the vicinity of the data communications device 20. For example, during operation, as the housing 40 absorbs heat from the circuit boards 46, the housing 40 radiates the heat to the atmosphere and, as a result, heats the atmospheric gasses located below the lower surface 56. The curvature of the lower surface 56 allows the heated gas to flow from the location below the lower surface 56, toward top of housing 40, and into the atmosphere. Therefore, such a configuration minimizes a build-up of relatively high temperature gasses in a location in proximity to the device and maintains operability of the device 20.

The card chassis 43 also includes first and second side walls 58, 60 adapted to provide thermal protection to the circuit boards 46. For example, as illustrated, each of the side walls 58, 60 includes a series of protrusions 62 and depressions 64 that increase the overall surface area of the card chassis 43. With such a relatively large surface area, the configuration of the side walls 58, 60 of the card chassis 43 increases the thermal transfer between the data communications device 20 and the atmosphere during operation.

Returning to FIG. 3, the end caps 42, 44 are configured to environmentally seal the circuit boards 46 within the card chassis 43 to protect the circuit boards from moisture such as present when the data communications device 20 is used in an outdoor environment. For example, each end cap 42, 44, such as formed from a diecast aluminum material, includes a primary gasket 62, such as a silicon rubber grommet, that aids in environmentally sealing the data communications device 20. When the end caps 42, 44 attach to the card chassis 43, such as by fasteners 68, each end cap 42, 44 compresses its corresponding primary gasket 66 against the card chassis 43 to form a fluid tight seal that provides a barrier between an inner space defined by the housing 40 and an outer atmosphere and that limits or prevents air or liquid from entering the housing 40. Each end cap 42, 44 can also include secondary gaskets 70 disposed between the end caps 42, 44 and interface connectors 45 disposed on each end cap 42, 44. The secondary gaskets 70 are also configured to limit or prevents air or liquid from entering the housing 40.

The interface connectors 45 on each end cap 42, 44 are adapted to allow a user to connect the data communications device 20 to external computerized devices. For example, the first end cap 44 includes connectors 72, such as serial cable ports, USB ports, and antenna connection ports. The ports 72 allow a user to physically or wirelessly connect a peripheral transmitter device 12, such as a laptop computer or video camera, to the data communications device 20. In another example, the second end cap 44 includes connectors 74, such as an antenna connection port, that allows the data communications device 20 to transmit data to a receiver device 14.

Figure 5:
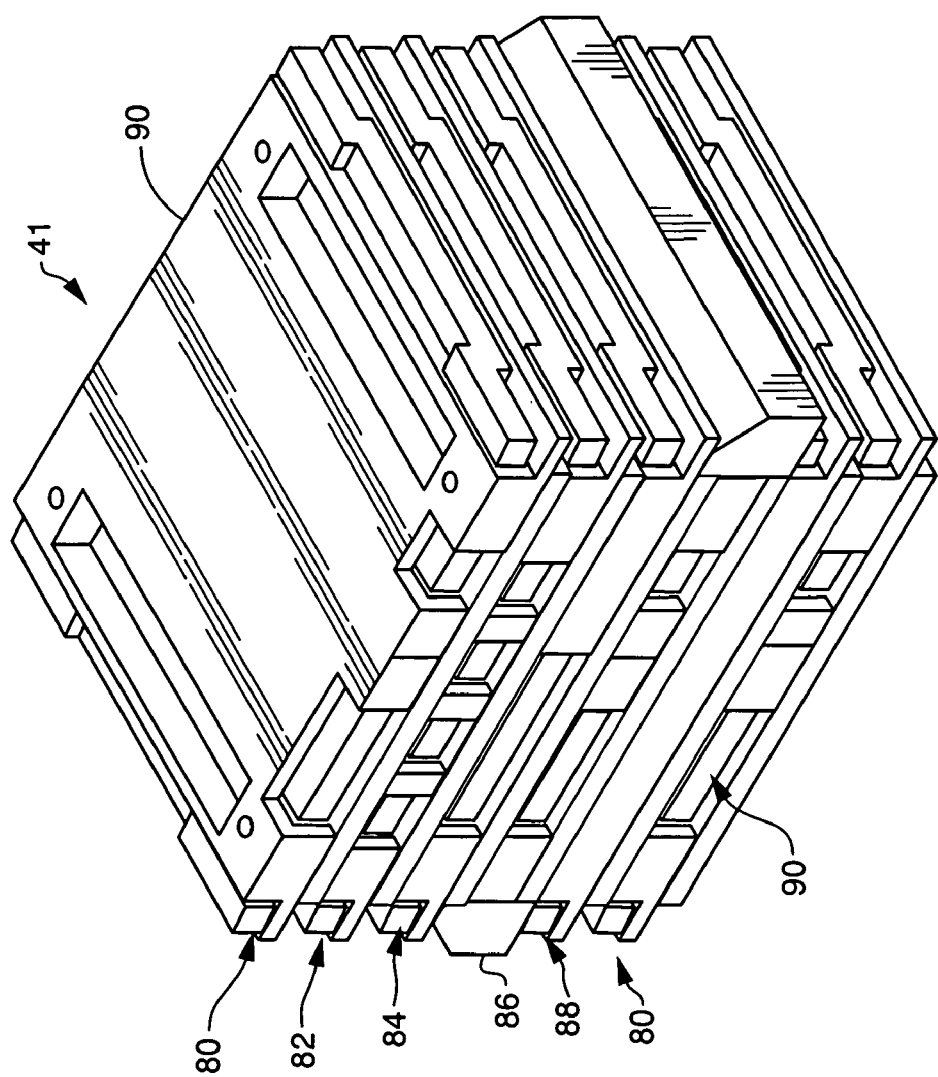
FIG. 5 illustrates a card stack assembly of the of the data communications device of FIG. 1, according to one embodiment of the invention.

As illustrated in FIG. 5, the circuit boards 46 that form part of the data communications device 20 are configured to direct data communications from the transmitter device 12 to a receiver device 14. For example, the circuit boards 46 can include one or more wireless transceiver cards 80, an Ethernet switch card 82, a serial port interface card 84, and a router card 86 having an associated power card 88. In one arrangement, the wireless transceiver card 80 is configured as a Wireless Mobile Interface Card (WMIC) is a mobile interface card configured as a wireless access point or wireless bridge that provides the data communications device 20 with a wireless interface. The Ethernet switch card, in one arrangement, is configured as a Fast Ethernet Switch Mobile Interface Card (FESMIC) that provides the data communications device 20 with auto-sensing switched Ethernet interfaces, for example. In one arrangement, the router card 86 is configured as a Mobile Access Router Card (MARC).

Figure 8:
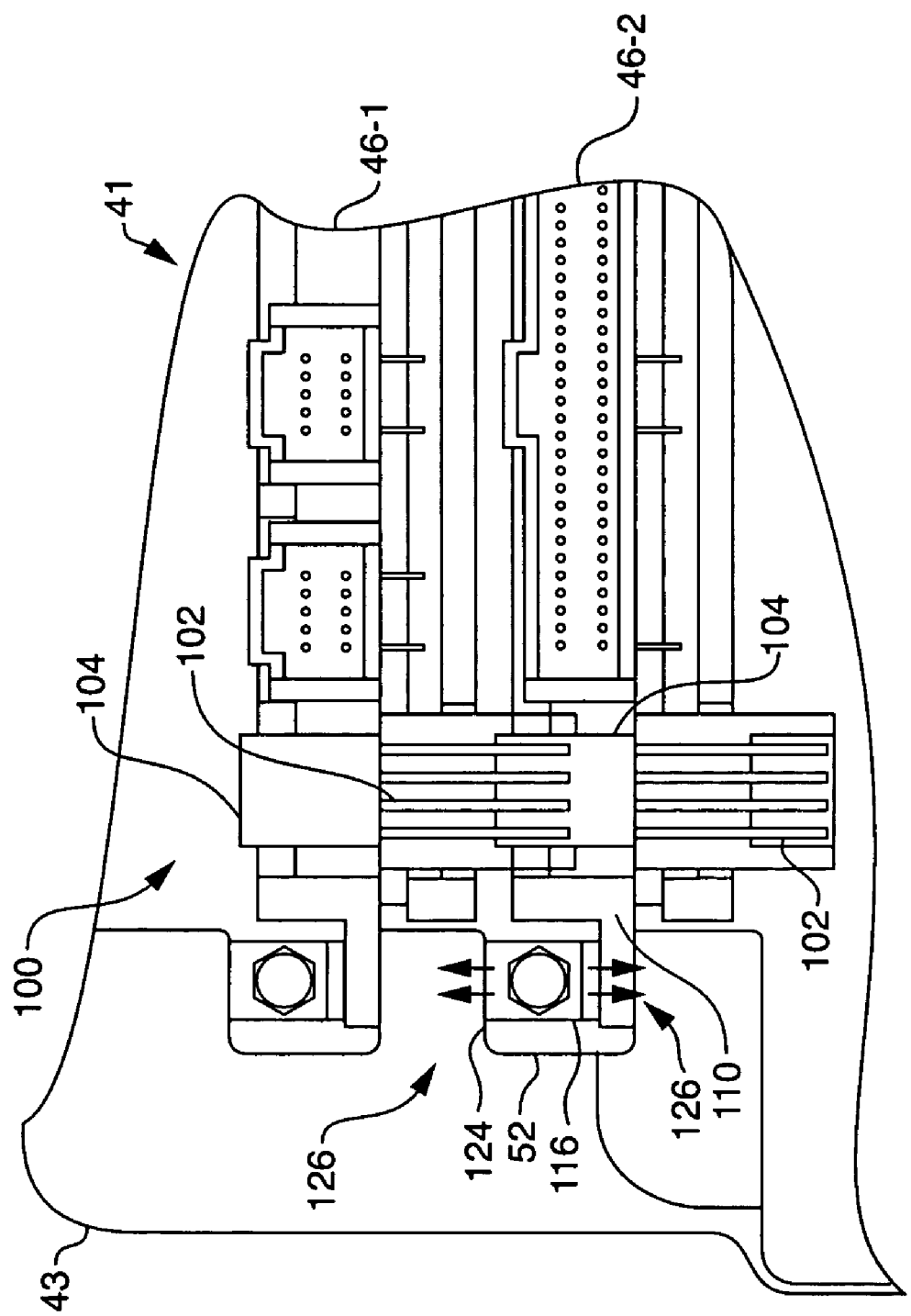
FIG. 8 illustrates a schematic sectional view of the thermal transfer assembly of the data communications device of FIG. 1, according to one embodiment of the invention.

In one arrangement, the circuit boards 46 electrically couple with each other in a stacked arrangement to form the card stack assembly 41. For example, the circuit boards 46 are configured as PC104 or PC104 Plus boards having connection elements that allow the circuit boards 46 to couple with each other without requiring the use of a backplane or interconnecting cable to provide electrical communication among the cards. In such a configuration, such as illustrated in FIG. 8, each circuit board 46 includes an interconnection element 100 having a set of pins 102 and a set of receptacles 104 extending from opposing surfaces of the circuit board 46. In use, the pins 104 of an interconnection element 100 of a first circuit board 46-1 insert within a receptacle of an interconnection element 100 of a second board 46-1 to electrically couple and allow electrical communication between the circuit boards 46-1, 46-2. Interconnection of the boards in such a manner minimizes the overall volume taken up by the circuit boards 46 within the housing 40 and, as a result, reduces the overall size of the data communications device 20. Additionally, such interconnection provides the data communications device 20 with a level of modularity such that a user can disconnect the circuit boards 46 from each other and upgrade or add circuit board cards to the data communications device 20 over time.

Figure 6A:
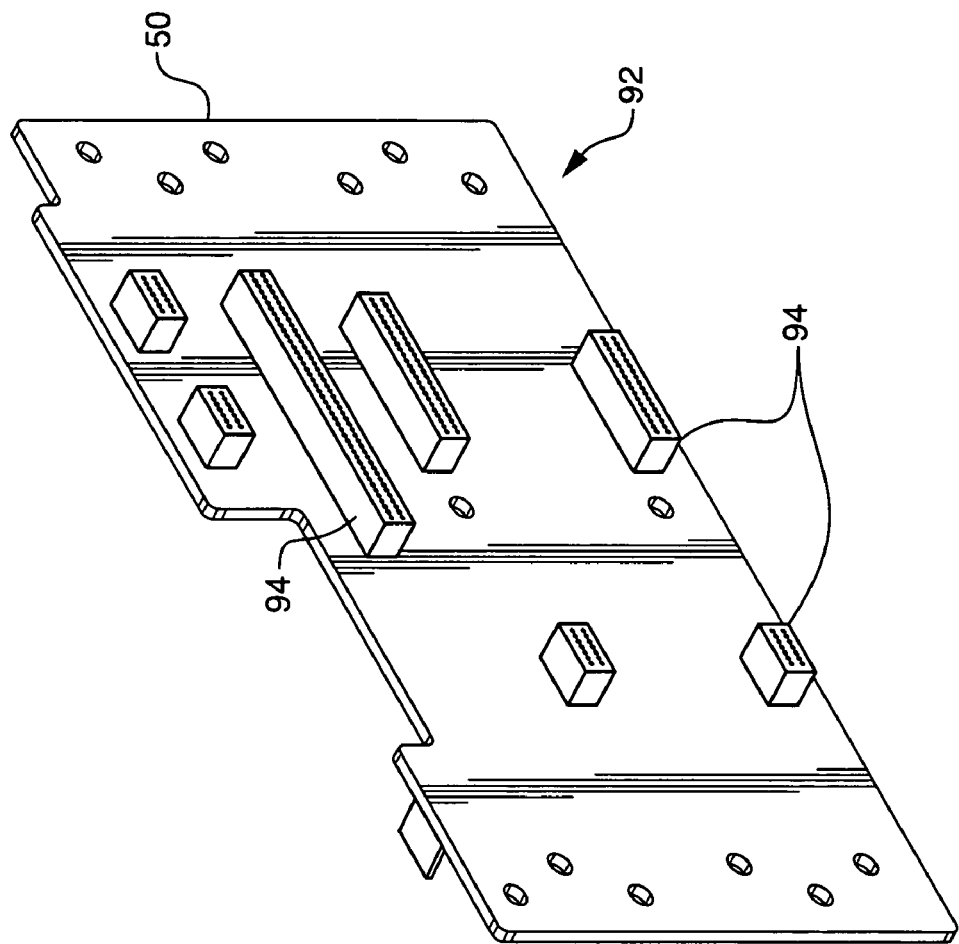
FIG. 6A illustrates a circuit board stack mounting side of a wiring card of the data communications device of FIG. 1, according to one embodiment of the invention.
Figure 6B:
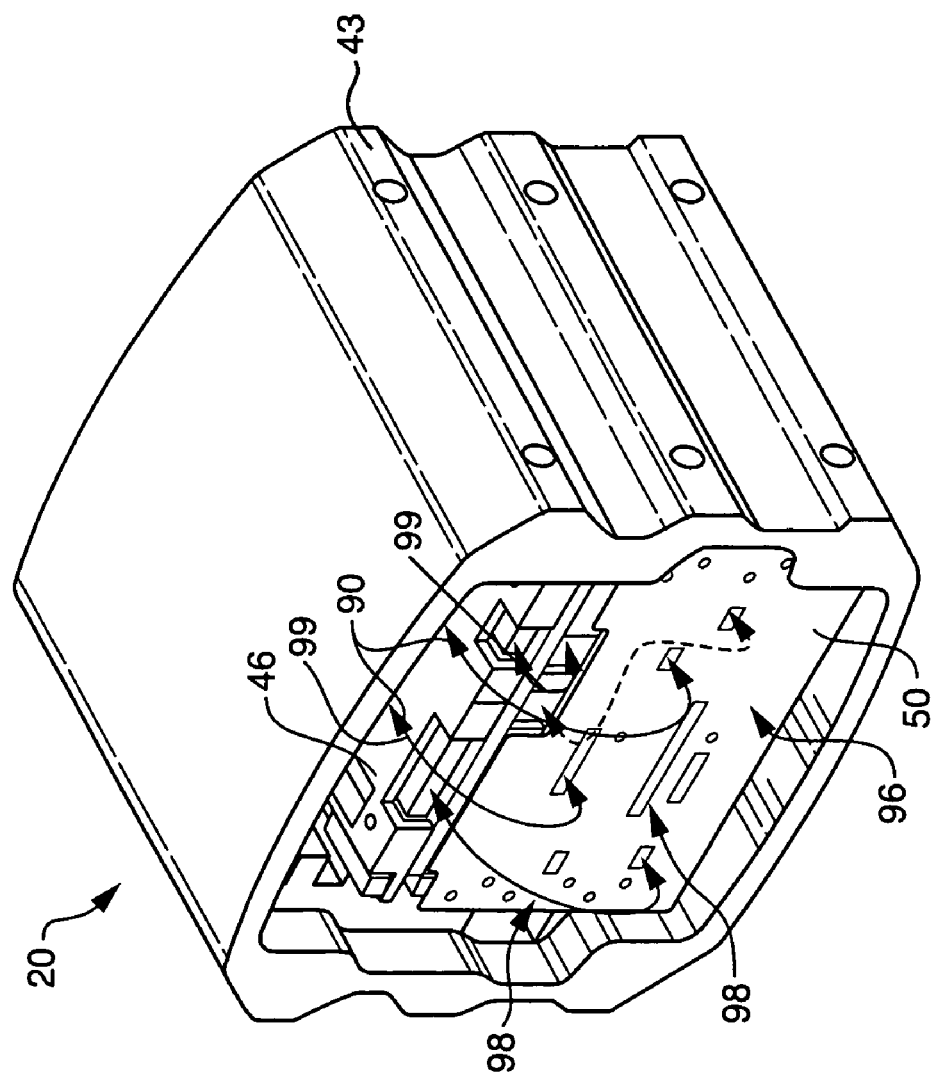
FIG. 6B illustrates an end cap mounting side of the wiring card of FIG. 6A, according to one embodiment of the invention.

Returning to FIG. 5, each of the circuit boards 46 include ports 90 configured to electrically couple to the connectors 45 on the end caps 42, 44. While the ports 90 of the circuit boards 46 can be electrically coupled to the connectors 45 on the end caps 42, 44 in a variety of ways, in one arrangement illustrated in FIGS. 3, 6A, and 6B, the data communications device 20 includes a wiring card 50 used to electrically couple the ports 90 with the end cap connectors 45. For example, as shown in FIG. 6A, the wiring card includes a circuit board stack mounting side 92 having a series of connectors 94 configured to interconnect with ports 90 of the circuit boards 46. As indicated in FIG. 6B, these connectors 94 are electrically coupled to connectors 98 disposed on an end cap connection side 96 of the wiring card 50. The connectors 98 can either electrically couple to the connectors 45 on the end caps 42, 44 or can electrically couple to ports 90 of other circuit boards 46 within the stack, such as by cable connectors 99. The use of the wiring card 50 within the data communications device 50 minimizes the number of cables used to electrically couple the circuit boards 46 to the end cap connectors 45 and therefore minimizes the overall size of the data communications device 20.

As indicated above, the card chassis 43 and end caps 42, 44 of the data communications device 20 form an environmentally sealed housing 40 configured to provide a barrier between an inner space defined by the housing 40 and an outer atmosphere. In such an environmentally sealed configuration, during operation, the data communications device 20 can substantially contain heat generated by circuit board components of the circuit boards 46 within the housing 40. The thermal transfer assembly 48 of the data communications device 20 is configured to conduct heat from the circuit board components to the housing 40 for dissipation to the external atmosphere. By conducting the heat from the circuit board components, as opposed to convecting heat, the thermal transfer assembly 48 minimizes the necessity for moving parts within the data communications device 20, such as fan assemblies, which are prone to failure. As a result, the data communications device 20 does not require maintenance or monitoring and can be mounted in remote or hard to reach locations, such as on the traffic signal pole 16 shown in FIG. 2A.

Figure 7A:
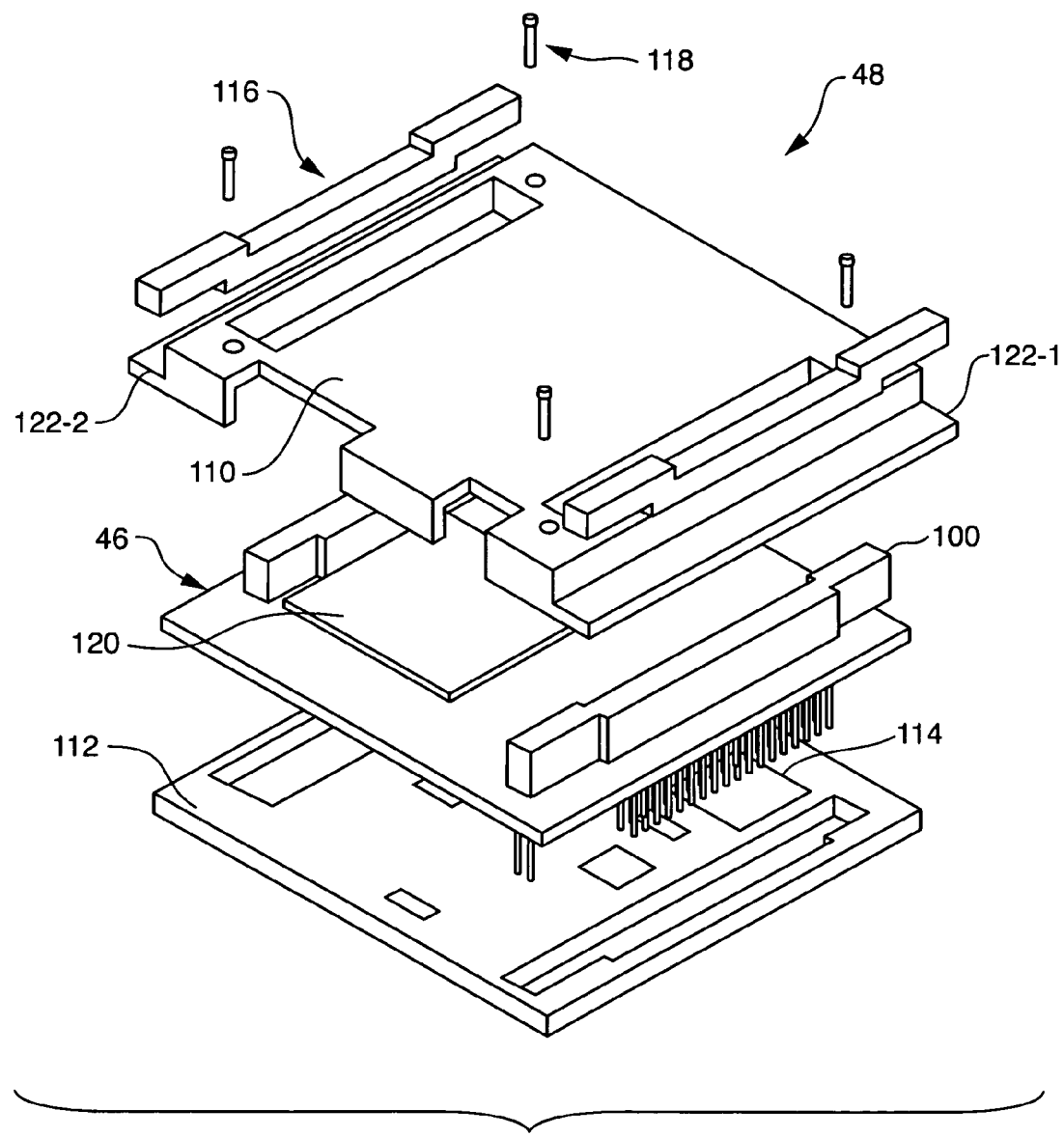
FIG. 7A illustrates an exploded view of a circuit board and thermal transfer assembly of the data communications device of FIG. 1, according to one embodiment of the invention.

FIG. 7A illustrates an embodiment of the thermal transfer assembly 48 according to one embodiment of the invention. The thermal transfer assembly 48 is adapted to thermally couple circuit board components 120 of a circuit board 46 to the data communications device's card chassis 43 and includes one or more plates 110, 112, thermal conductors 114, and coupling elements 116.

The plates 110, 112 and thermal conductors 114 are configured to conduct heat away from the circuit board components 120 of the circuit board 46. For example, each of the plates 110, 112 is formed from a thermally conducive material, such as an aluminum material. The thermal conductors 114, in turn, are formed of a thermally conductive material and are configured to thermally couple each plate 110, 112 to the circuit board components 120 of the circuit board 46. For example, the thermal conductors 114 are disposed between each of the plates 110, 112 and opposed surfaces of the circuit board 46 and are positioned in proximity to the circuit board components 120 of the circuit board 46. When the plates 110, 112 are coupled to the circuit board 46, such as by fasteners 118, such coupling causes the thermal conductors 114 to thermally contact both the circuit board components 120 and plates 110, 112.

In one arrangement, the thermal conductors 114 are formed from a substantially compliant material adapted to conform to a surface of circuit board component, such as T-FLEX 600 (Laird Technologies, Cleveland, Ohio). In such an arrangement, when the plates 110, 112 are coupled to the circuit board 46, the plates 110, 112 compress the compliant thermal conductors 114 between the respective plates 110, 112 and circuit board components 120. As a result, the compliant thermal conductors 114 deform in response to such compression to limit the presence of gaps and maximize thermal transfer between the plates 110, 112 and the circuit board components 120.

At least one of the plates 110, 112, such as plate 110 shown in FIG. 7A, is configured to thermally contact the card chassis 43 of the data communications device 20 to transfer thermal energy away from the circuit board components 120. For example, in one arrangement, the plate 110 includes mounting tabs 122-1, 122-2 configured to insert within opposed housing slots 52 as shown in FIG. 4. As the circuit board 46 and plate 110 inserts within the housing slots 52, the mounting tabs 122-1, 122-2 thermally couple with the card chassis 43, thereby allowing conduction of heat from the circuit board components 120 to the housing 40. The housing 40, therefore, acts as a heat sink for the circuit board components and, as such, maintains the operability of the data communications device 20.

The thermal transfer assembly 48 also includes coupling elements 116 operable to thermally couple the plate 110 to the card chassis 43 to maximize thermal transfer therebetween. For example, the coupling element 116 is configured to also insert within the slots 52 of the card chassis 43 and expand within the slot 52 to thermally couple the plate 110 to the housing. In one arrangement, as shown in FIG. 7B, the coupling element 116 is configured as a WEDGE-LOK having a primary compression element 130, secondary compression elements 132, and compression adjustment mechanisms 134, such as screws, which cause the secondary compression elements 132 to "expand" or move relative to the primary compression element 130 to thermally couple the plate 110 to the housing 40.

Figure 7B:
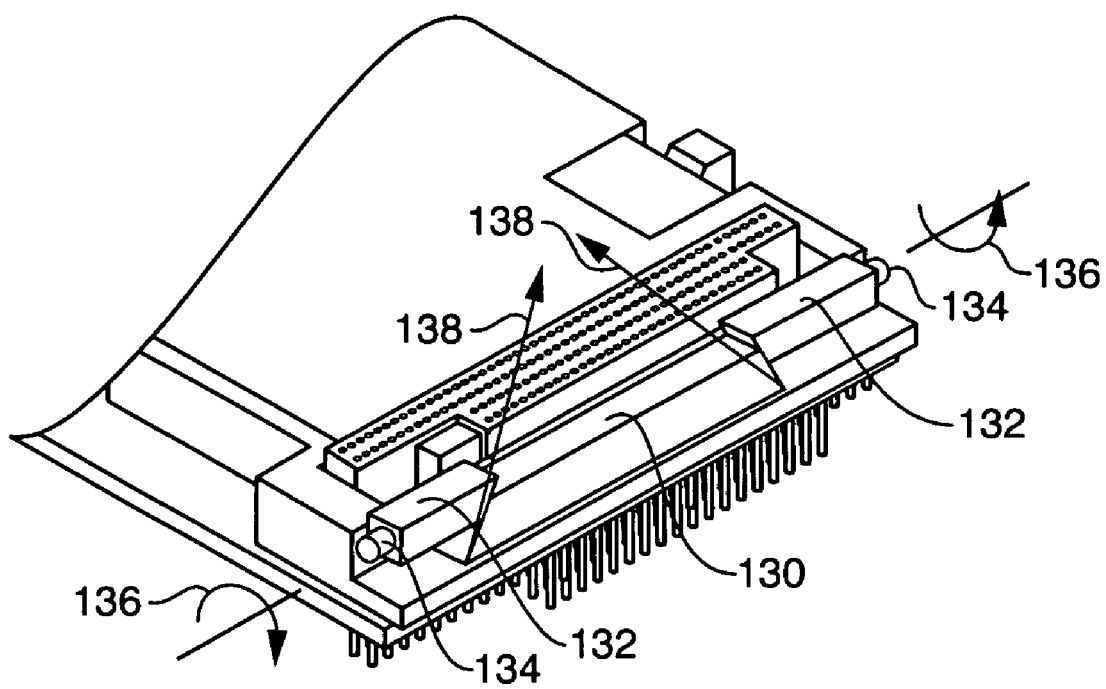
FIG. 7B illustrates a coupling element of the thermal transfer assembly of FIG. 7A, according to one embodiment of the invention.

In use, taking FIG. 7B in conjunction with FIG. 8, an assembler inserts the plate 110 and card stack assembly 41 within the card chassis 43 such that the opposed mounting tabs 122-1, 122-2 of the plate 110 insert within the opposed slots 52 of the housing. The assembler then inserts coupling elements 116 within the slots 52 such that each coupling element 116 is disposed between a mounting tab 122-1, 122-2 of the plate 110 and a slot wall 124 of the card chassis 43. The assembler then expands the coupling element 116 within the slot 52 to physically and thermally couple the plate 10 to the housing 40. For example, in the case where the coupling element is a WEDGE-LOK, the assembler rotates the compression adjustment mechanisms 134 along the direction 136 to cause the corresponding secondary compression elements 134 to move along direction 138 relative to the primary compression element 130. With such motion, the secondary compression elements 134 engage the slot wall 124 and generate compressive forces 126 which physically secures the plate 110 and circuit board 46 to the card chassis 43 and which minimizes the presence of air gaps between the plate 110 and the slot 52, thereby maximizing thermal transfer between the plate 110 and the housing 40.

While this invention has been particularly shown and described with references to preferred embodiments thereof, it will be understood by those skilled in the art that various changes in form and details may be made therein without departing from the spirit and scope of the invention as defined by the appended claims.

For example, as indicated in FIG. 3, the card chassis 43 is configured to hold up to seven circuit boards 46 to form the data communications device 20. Such indication is by way of example only. In one embodiment, the card chassis 43 is configured to contain any number of circuit boards 46.

Figure 9A:
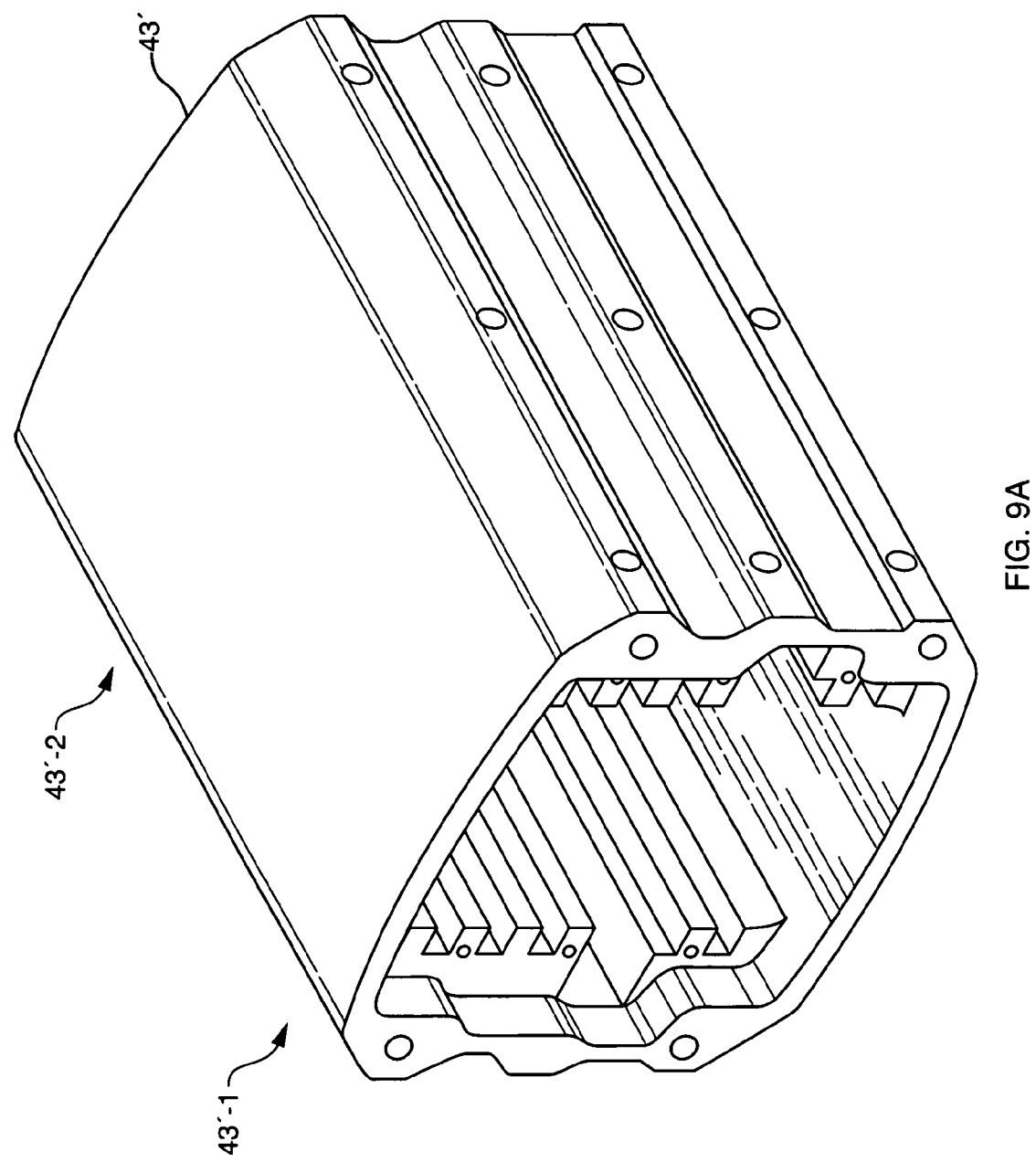
FIG. 9A illustrates a housing of the data communications device of FIG. 1, according to one embodiment of the invention.
Figure 9B:
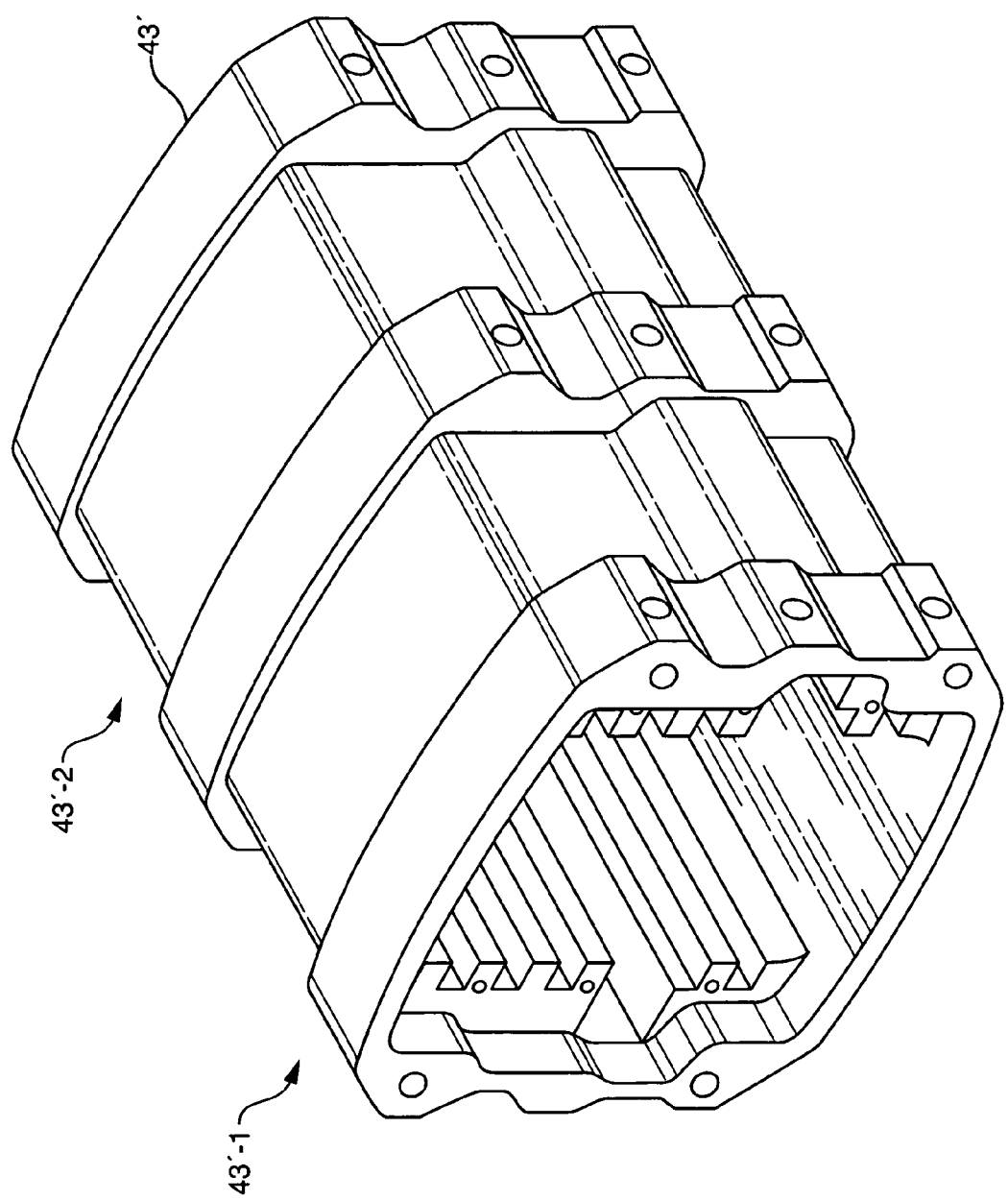
FIG. 9B illustrates a housing of the data communications device of FIG. 1, according to another embodiment of the invention.

For example, as illustrated in FIGS. 9A and 9B, the card chassis 43' is configured to contain up to fourteen circuit boards 46. As shown, the card chassis 43' is formed to contain two sets of circuit board stacks such that a first stack of seven circuit boards 46 is secured within a first chassis portion 43'-1 and a second stack of seven circuit boards is secured within a second chassis portion 43'-2. Such a configuration of the card chassis 43' allows an additional number of circuit boards 46 to used in the data communications device 20 to increase the bandwidth of the device 20.

Figure 10A:
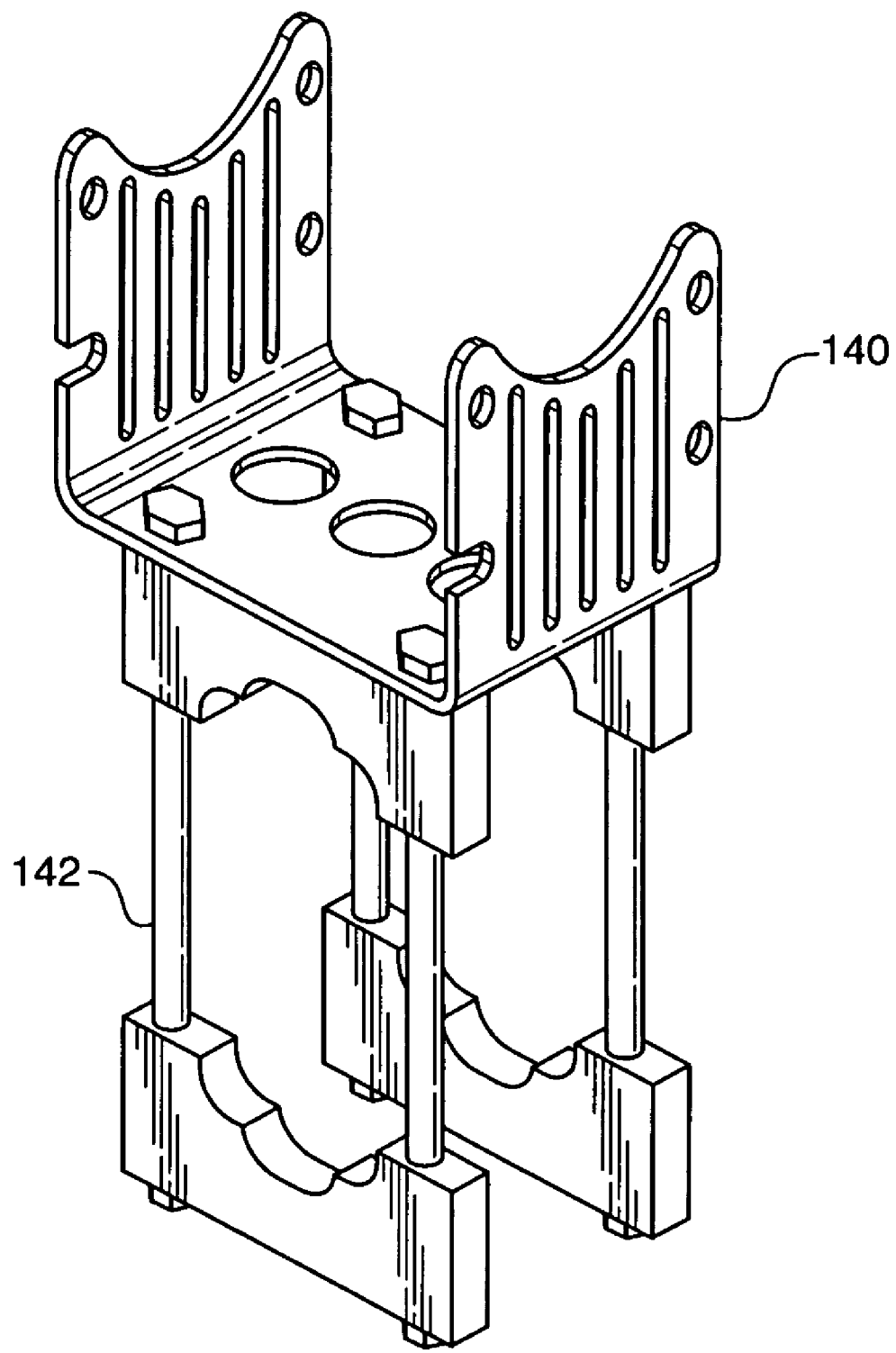
FIG. 10A illustrates a mounting apparatus for the data communications device of FIG. 1, according to one embodiment of the invention.
Figure 10B:
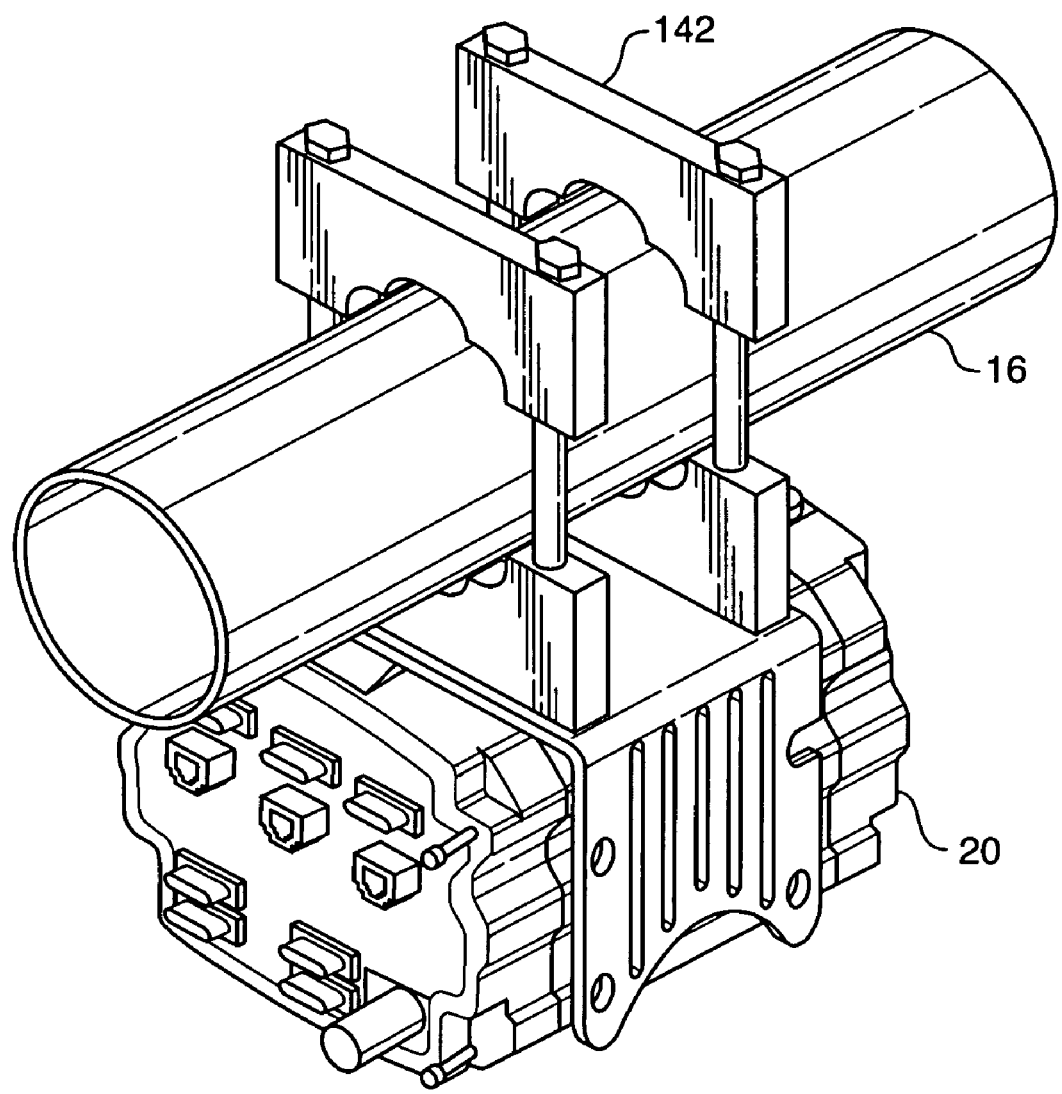
FIG. 10B illustrates the mounting apparatus of FIG. 10A and the data communications device of FIG. 1 mounted to a stationary location in an outdoor environment.

Also as indicated above, the data communications device 20 is configured to operate in an outdoor location, such as on a traffic signal pole 16 or in a vehicle 18. In one arrangement, as shown in FIGS. 10A and 10B, the data communications device 20 includes a mounting bracket 140 that attaches to the housing 40 of the data communications device 20 and that is operable to secure the device 20 in an outdoor location. For example, the mounting bracket 140 can include a corresponding pole mounting device 142 that allows a user to secure the device to a traffic signal pole 16.

As indicated above, the data communications device 20 is configured to operate in an outdoor location, such as stationary outdoor location (e.g., the traffic signal pole 16) or mobile outdoor location (e.g., vehicle 18). When used in a stationary location, the data communications device 20 is not limited to being mounted on a pole 16 and can be mounted to any stationary object, such as a rooftop, telephone pole, traffic controller cabinet, or tower for example. Additionally, when used in a mobile location, the data communications device 20 is not limited to being mounted within a vehicle, such as an automobile and can be mounted to any mobile object such as a train, airplane, boat, or person, for example.

What is claimed is:

1. A data communications device, comprising:
   an environmentally sealed housing having a card chassis and at least one end cap coupled to the card chassis, the housing configured to provide a barrier between an inner space defined by the housing and an outer space;
   a plurality of circuit boards disposed within the inner space of the housing, at least one of the plurality of circuit boards being configured to receive data from a source and direct data to a destination; and
   a thermal transfer assembly adapted to thermally couple at least one circuit board component of the plurality of circuit boards to the housing, the thermal transfer assembly comprising:
   a plate coupled to the at least one circuit board,
   a thermal conductor disposed between the plate and the at least one circuit board, the thermal conductor being configured to provide thermal communication between a circuit board component of the at least one circuit board and the plate, and
   a coupling element operable to thermally couple the plate to the housing;
   wherein:
   the card chassis defines a slot configured to support the conductive plate coupled to the at least one circuit board; and
   the coupling element comprises a primary compression element and a secondary compression element, the secondary compression element of the coupling element is configured to move relative to the primary compression element of the coupling element to thermally couple the plate to the housing.

2. The data communications device of claim 1, wherein the plate comprises a first plate and a second plate, the at least one circuit board disposed between the first plate and the second plate.

3. The data communications device of claim 1, wherein the thermal conductor comprises a substantially compliant material adapted to conform to a surface of at least one of the plate and the circuit board component.

4. The data communications device of claim 1, wherein the plurality of circuit boards are configured as modular circuit boards.

5. The data communications device of claim 4, wherein each of the plurality of circuit boards comprises an interconnection element having a set of pins and a set of receptacles extending from opposing surfaces of the circuit board, the interconnection element operable to provide electrical coupling of the plurality of circuit boards.

6. The data communications device of claim 1, wherein the plurality of circuit boards are selected from the group consisting of a wireless transceiver card, an Ethernet switch card, a serial port interface card, and a router card.

7. The data communications device of claim 1, wherein the environmentally sealed housing comprises a gasket disposed between the at least one end cap and the card chassis, the housing configured to provide moisture protection to the plurality of circuit boards.

8. The data communications device of claim 1, wherein the chassis comprises an upper housing portion having a substantially curved profile.

9. The data communications device of claim 1, wherein the chassis comprises a lower housing portion having a substantially curved profile.

10. The data communications device of claim 1, wherein the at least one end cap comprises at least one interface connector and wherein the data communications device comprises a wiring card disposed between the at least one end cap and connection ports of at least one of the plurality of circuit boards, the wiring card configured to provide electrical communication between the at least one interface connector of the at least one end cap and the connection ports of the at least one of the plurality of circuit boards.

11. A data communications device, comprising:
    an environmentally sealed housing having a card chassis and at least one end cap coupled to the card chassis, the housing configured to provide a barrier between an inner space defined by the housing and an outer space;
    a plurality of circuit boards disposed within the housing, at least one of the plurality of circuit boards being configured to receive data from a source and direct data to a destination; and
    a thermal transfer assembly adapted to thermally couple a circuit board component of at least one circuit board of the plurality of circuit boards to the
    housing to transfer heat from a circuit board component to the housing via conduction;
    wherein the thermal transfer assembly comprises:
    a plate coupled to the at least one circuit board;
    a compliant thermal conductor disposed between the plate and the at least one circuit board, the compliant thermal conductor being configured to thermally couple the circuit board component of the at least one circuit board to the plate; and
    a coupling element operable to thermally couple the plate to the housing;
    wherein the plate comprises a first plate and a second plate, the at least one circuit board disposed between the first plate and the second plate; wherein:

the card chassis defines a slot configured to support the conductive plate coupled to the at least one circuit board; and the coupling element comprises a primary compression element and a secondary compression element, the secondary compression element of the coupling element is configured to move relative to the primary compression element of the coupling element to thermally couple the plate to the housing.

12. The data communications device of claim 11, wherein the thermal conductor comprises a substantially compliant material adapted to conform to a surface of at least one of the plate and the circuit board component.

13. The data communications device of claim 11, wherein the plurality of circuit boards are configured as modular circuit boards.

14. The data communications device of claim 13, wherein each of the plurality of circuit boards comprises an interconnection element having a set of pins and a set of receptacles extending from opposing surfaces of the circuit board, the interconnection element operable to provide electrical coupling of the plurality of circuit boards.

15. The data communications device of claim 11, wherein the plurality of circuit boards are selected from the group consisting of a wireless transceiver card, an Ethernet switch card, a serial port interface card, and a router card.

16. The data communications device of claim 11, wherein the at least one end cap comprises at least one interface connector and wherein the data communications device comprises a wiring card disposed between the at least one end cap and connection ports of at least one of the plurality of circuit boards, the wiring card configured to provide electrical communication between the at least one interface connector of the at least one end cap and the connection ports of the at least one of the plurality of circuit boards.

17. A method for assembling a data communications device, comprising:

thermally coupling a circuit board to a thermally conductive plate, the thermally conductive plate having a compliant thermally conductive material in thermal communication with the thermally conductive plate and at least one circuit board component of the circuit board;

inserting the circuit board and thermally conductive plate within a slot of a card chassis of a data communications device housing; and expanding a thermal coupling element within the slot to thermally couple the thermally conductive plate to the housing;

wherein expanding a thermal coupling element within the slot to thermally couple the thermally conductive plate to the housing comprises:

actuating at least one compression adjustment mechanism of the thermal coupling element; and positioning at least one secondary compression element relative to a primary compression element carried by the thermally conductive plate between a first position to allow insertion of the plate into the slot defined by the card chassis and a second position to secure and thermally couple the thermally conductive plate to the housing.

18. The method of claim 17, comprising coupling at least one end cap to the card chassis to form an environmentally sealed housing, the housing configured to provide a barrier between an inner space defined by the housing and an outer space.

19. The data communications device of claim 2, wherein the coupling element comprises the primary compression element carried by the first plate, at least one secondary compression element carried by the primary compression element, and at least one compression adjustment mechanism carried by the at least one secondary compression element, the at least one compression adjustment mechanism being constructed and arranged to position the at least one secondary compression element between a first position to allow insertion of the first plate into the slot defined by the card chassis and a second position to secure and thermally couple the first plate to the housing.

20. The data communications device of claim 19, wherein:

each of the plurality of circuit boards comprises an interconnection element having a first connection portion extending from a first planar surface of the circuit board and a second connection portion extending from a second planar surface of the circuit board, the first surface opposing the second surface, the interconnection element constructed and arranged to provide electrical coupling between a first circuit board of the plurality of circuit boards, a second circuit board of the plurality of circuit boards disposed in proximity to the first connector portion of the first circuit board, and a third circuit board of the plurality of circuit boards disposed in proximity to the second connector portion of the first circuit board; and the first plate is disposed in proximity to the first planar surface of the at least one circuit board and the second plate is disposed in proximity to the second planar surface of the at least one circuit board, the first plate defining at least one opening sized and arranged to frame the first connection portion and to allow electrical access to the first connection portion, and the second plate defining at least one opening sized and arranged to frame the second connection portion and to allow electrical access to the second connection portion.

21. The data communications device of claim 20, wherein the plate carries the thermal conductor disposed between the plate and the at least one circuit board, the thermal conductor being configured to provide thermal communication between the circuit board component of the at least one circuit board and the plate, wherein the thermal conductor comprises a compliant material adapted to conform to a surface of the circuit board component.

* * * * *